United States Patent
Cho et al.

(10) Patent No.: US 7,857,907 B2
(45) Date of Patent: Dec. 28, 2010

(54) METHODS OF FORMING SILICON NANOCRYSTALS BY LASER ANNEALING

(75) Inventors: An-Thung Cho, Hsin-Chu (TW); Chih-Wei Chao, Hsin-Chu (TW); Chia-Tien Peng, Hsin-Chu (TW); Wan-Yi Liu, Hsin-Chu (TW); Ming-Wei Sun, Hsin-Chu (TW)

(73) Assignee: AU Optronics Corporation, Hsinchu (TW)

( * ) Notice: Subject to any disclaimer, the term of this patent is extended or adjusted under 35 U.S.C. 154(b) by 802 days.

(21) Appl. No.: 11/698,261

(22) Filed: Jan. 25, 2007

(65) Prior Publication Data
US 2008/0178794 A1    Jul. 31, 2008

(51) Int. Cl.
    *C30B 25/00*    (2006.01)
    *C30B 28/12*    (2006.01)

(52) U.S. Cl. ............... 117/92; 117/88; 117/98; 117/99; 117/100; 117/101; 117/102; 117/103; 117/104; 117/105; 977/784; 977/809; 977/814; 977/844; 977/890; 977/891

(58) Field of Classification Search ........... 117/88, 117/92, 98–105; 977/784, 809, 814, 844, 977/890–891
See application file for complete search history.

(56) References Cited

U.S. PATENT DOCUMENTS

| | | | |
|---|---|---|---|
| 5,994,157 A | 11/1999 | Aggas et al. | |
| 6,164,958 A | 12/2000 | Huang et al. | |
| 6,184,158 B1 * | 2/2001 | Shufflebotham et al. | 438/788 |
| 6,326,311 B1 | 12/2001 | Ueda et al. | |
| 6,410,412 B1 * | 6/2002 | Taira et al. | 438/594 |
| 6,483,861 B2 * | 11/2002 | Moon | 372/45.01 |
| 6,544,870 B2 * | 4/2003 | Park et al. | 438/507 |
| 6,597,496 B1 | 7/2003 | Nayfeh et al. | |
| 6,710,366 B1 * | 3/2004 | Lee et al. | 257/14 |
| 6,846,474 B2 | 1/2005 | Nayfeh et al. | |
| 6,888,200 B2 * | 5/2005 | Bhattacharyya | 257/348 |
| 6,984,842 B1 | 1/2006 | Nayfeh et al. | |

(Continued)

OTHER PUBLICATIONS

Rosmeulen, M. et al., "Electrical Characterisation of Silicon-Rich-Oxide Based Memory Cells Using Pulsed Current-Voltage Techniques," *Essderc*, pp. 471-474, IMEC, Kapeldreef 75, 3001 Leuven, Belgium (2002).

*Primary Examiner*—Robert M Kunemund
*Assistant Examiner*—G. Nagesh Rao
(74) *Attorney, Agent, or Firm*—Tim Tingkang Xia; Morris, Manning & Martin, LLP

(57) ABSTRACT

The present invention relates to a method for forming a layered structure with silicon nanocrystals. In one embodiment, the method comprises the steps of: (i) forming a first conductive layer on a substrate, (ii) forming a silicon-rich dielectric layer on the first conductive layer, and (iii) laser-annealing at least the silicon-rich dielectric layer to induce silicon-rich aggregation to form a plurality of silicon nanocrystals in the silicon-rich dielectric layer. The silicon-rich dielectric layer is one of a silicon-rich oxide film having a refractive index in the range of about 1.4 to 2.3, or a silicon-rich nitride film having a refractive index in the range of about 1.7 to 2.3. The layered structure with silicon nanocrystals in a silicon-rich dielectric layer is usable in a solar cell, a photodetector, a touch panel, a non-volatile memory device as storage node, and a liquid crystal display.

22 Claims, 5 Drawing Sheets

U.S. PATENT DOCUMENTS

| | | | |
|---|---|---|---|
| 6,992,298 B2 | 1/2006 | Nayfeh et al. | |
| 7,087,537 B2* | 8/2006 | Joshi et al. | 438/778 |
| 7,184,312 B2* | 2/2007 | Bhattacharyya | 365/185.19 |
| 7,259,106 B2* | 8/2007 | Jain | 438/737 |
| 7,339,830 B2* | 3/2008 | Bhattacharyya | 365/185.18 |
| 7,381,595 B2* | 6/2008 | Joshi et al. | 438/149 |
| 7,446,023 B2* | 11/2008 | Joshi et al. | 438/475 |
| 7,521,292 B2* | 4/2009 | Rogers et al. | 438/118 |
| 7,544,625 B2* | 6/2009 | Joshi et al. | 438/778 |
| 2004/0041206 A1* | 3/2004 | Bhattacharyya | 257/326 |
| 2004/0106285 A1* | 6/2004 | Zacharias | 438/689 |
| 2005/0026353 A1* | 2/2005 | Bhattacharyya | 438/232 |
| 2006/0043383 A1 | 3/2006 | Yang et al. | |
| 2006/0189014 A1* | 8/2006 | Li et al. | 438/28 |
| 2006/0194454 A1 | 8/2006 | Hughes et al. | |
| 2006/0211267 A1* | 9/2006 | Joshi et al. | 438/778 |
| 2006/0286785 A1* | 12/2006 | Rogers et al. | 438/584 |
| 2007/0138555 A1* | 6/2007 | Bhattacharyya | 257/347 |
| 2008/0048240 A1* | 2/2008 | Kamath et al. | 257/315 |
| 2008/0178794 A1* | 7/2008 | Cho et al. | 117/103 |
| 2008/0179762 A1* | 7/2008 | Cho et al. | 257/E31.001 |
| 2009/0009675 A1* | 1/2009 | Cho et al. | 349/43 |
| 2009/0191680 A1* | 7/2009 | Walker | 438/283 |
| 2009/0232449 A1* | 9/2009 | Zhang et al. | 385/31 |
| 2009/0280606 A1* | 11/2009 | Shih et al. | 438/155 |
| 2009/0294028 A1* | 12/2009 | Heck et al. | 156/153 |

\* cited by examiner

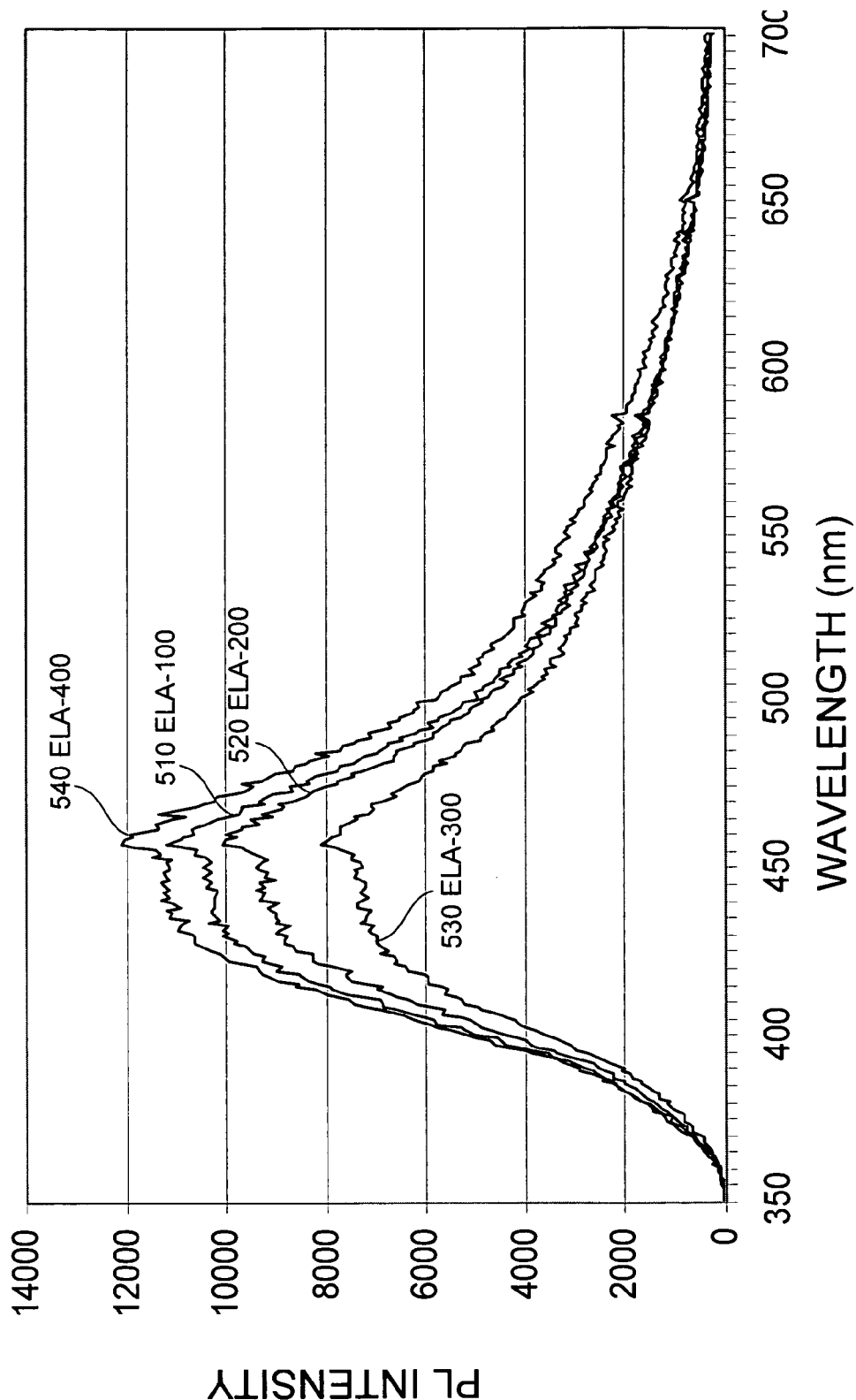

METHODS OF FORMING SILICON NANOCRYSTALS BY LASER ANNEALING

FIELD OF THE INVENTION

The present invention relates generally to a method of forming silicon nanocrystals by laser annealing upon a silicon-rich dielectric film.

BACKGROUND OF THE INVENTION

Photoluminescence (PL) devices find their applications in many areas such as solar cells, touch panels, UV-Blue photodetectors, as well as full-color, high quality TFT flat panel display. Such photoluminescence devices may be fabricated with nanocrystals. Traditionally, semiconductor materials such as Si, Ge are used to produce nanocrystals based on the concepts of band gap and quantum confinement effects of these materials. Exemplary PL devices are disclosed in published U.S. Patent Application 2006/0189014, which is incorporated herein in its entirety by reference for background information only. One widely-used method of fabricating silicon nanocluster is to precipitate the silicon nanocluster out of SiOx (where x<2), producing a film using chemical vapor deposition, radio frequency (RF)-sputtering, or Si implantation. This film is often called silicon-rich silicon oxide (SRSO) or silicon-rich oxide (SRO). Using the CVD or RF-sputtering processes, with a high-temperature annealing, a photoluminescence (PL) peak in the SRSO can typically be obtained in the wavelength range of 590 nanometers (nm) to 750 nm. However, these SRO materials exhibit low quantum efficiency and have a stability problem, which reduces the PL intensity height over time, and limits their application to PL devices.

Er implantation, creating Er-doped nanocrystal Si, is also used in Si-based light sources. However, state-of-the-art implantation processes have not been able to distribute the dopant uniformly, which lowers the light emitting efficiency and increases costs. At the same time, there has been no interface engineering sufficient to support the use of such a dopant. Using the $Si/SiO_2$ superlattice structure to control crystal size results in a slow, high-temperature deposition process that cannot simultaneously control both the Si particle size and the quality Si nanocrystal/$SiO_2$ interface. The device efficiency is very low, which limits the device applications. In order to improve the device efficiency, a large interface area must be created between nanocrystal Si and $SiO_2$.

On the other hand, the non-volatile-memory ("NVM") market today is dominated by floating-gate (FG) devices. According to the International Technology Roadmap for Semiconductors 2001, the tunnel oxide thickness of FG devices would remain at a level of about 9 nm for future generations. Scaling the tunnel oxide leads to anomalous charge leakage, caused by one or two defects in the oxide. Such a leakage causes the information stored in the non-volatile memory to be lost. Scaling the tunnel oxide also requires high operating voltage. Discrete charge storage bypasses this problem, hence allowing for scaling of the tunnel oxide and program/erase voltages. Reduction of the size of the charge pumps enabled by these lower voltages, as well as avoiding the double poly process required for FG devices, lowers the cost of integration especially important for embedded applications. This has triggered a renewed interest in NVM cells employing discrete, trap-like storage nodes.

Conventionally, silicon-rich nitride and silicon-rich oxide are used as the charge trapping medium to increase the retention and endurance of the information stored in the non-volatile memory devices. However, due to aforementioned manufacturing difficulties, these materials are not easily integrated in the conventional manufacturing process. A simple and efficient light-emitting device compatible with silicon, with a manufacturing process that does not require high temperature post annealing, with a process that is compatible with the conventional process to produce low temperature polysilicon thin film transistor (LTPS TFT) would be desirable in applications where photonic devices (light emitting and light detecting) are necessary.

Therefore, it is apparent that a heretofore unaddressed need exists in the art to address the aforementioned deficiencies and inadequacies.

SUMMARY OF THE INVENTION

The present invention, in one aspect, relates to a method for forming a layered structure with silicon nanocrystals in a silicon-rich dielectric layer. In one embodiment, the method includes the steps of: (i) forming a first conductive layer on a substrate, (ii) forming a silicon-rich dielectric layer on the first conductive layer, and (iii) laser-annealing at least the silicon-rich dielectric layer to induce silicon-rich aggregation to form a plurality of silicon nanocrystals in the silicon-rich dielectric layer. The first conductive layer can be a metal layer. In one embodiment, the silicon-rich dielectric layer is a silicon-rich oxide film. The silicon-rich oxide film has a refractive index in the range of about 1.4 to 2.3. In another embodiment, the silicon-rich dielectric layer is a silicon-rich nitride film. The silicon-rich nitride film has a refractive index in the range of about 1.7 to 2.3.

The step of forming a silicon-rich dielectric layer includes the steps of: (i) using a plasma-enhanced chemical vapor deposition (PECVD) process under a first set of conditions effective to form the silicon-rich dielectric layer with a corresponding thickness in the range of about 50 nm to 1000 nm, and (ii) changing the silicon content ratio of the silicon-rich dielectric layer to form the silicon-rich dielectric layer with a desired refractive index. The first set of conditions includes a process temperature effective in the range of about 200 to 400° C., and a process time effective in the duration of about 13 seconds to 250 seconds.

The silicon content ratio $SiH_4/N_2O$ can be adjusted in the range of about 1:10 to 1:1, therefore resulting in the refractive index of the silicon-rich dielectric layer to be at least in the range of about 1.5 to 2.3.

The laser annealing the silicon-rich dielectric layer includes excimer laser annealing the silicon-rich dielectric layer with an adjustable frequency and an adjustable laser power density at a temperature below 400° C.

When the silicon-rich dielectric layer is annealed, the laser power density is adjusted to form the plurality of silicon nanocrystals with desired diameters. In one embodiment, the laser power density is in the range of about 70 to 300 $mJ/cm^2$, and the diameters of the plurality of silicon nanocrystals are in the range of about 3 to 10 nm. In another embodiment, the laser power density is in the range of about 70 to 200 $mJ/cm^2$, and the diameters of the plurality of silicon nanocrystals are in the range of about 3 to 6 nm. In yet another embodiment, the laser power density is in the range of about 200 to 300 $mJ/cm^2$, and the diameters of the plurality of silicon nanocrystals are in the range of about 4 to 10 nm.

In one embodiment, the thickness of the silicon-rich dielectric layer is in the range of about 50 to 1000 nm. The density of the plurality of silicon nanocrystals is in the range of about $1\times10^{11}/cm^2$ to $1\times10^{12}/cm^2$.

In one embodiment, the layered structure with silicon nanocrystals in a silicon-rich dielectric layer is usable in a solar cell. In another embodiment, the layered structure with silicon nanocrystals in a silicon-rich dielectric layer is usable in a photodetector. In yet another embodiment, the layered structure with silicon nanocrystals in a silicon-rich dielectric layer is usable in a touch panel or ambient light sensor. In a further embodiment, the layered structure with silicon nanocrystals in a silicon-rich dielectric layer is usable in a nonvolatile memory device as storage nodes.

In one embodiment, the method includes the step of forming a second conductive layer on the silicon-rich dielectric layer. The second conductive layer can be a metal layer, an indium tin oxide (ITO) layer, or a combination of them. In one embodiment, the second conductive layer is an indium tin oxide (ITO) layer formed on the silicon-rich dielectric layer, which is usable in a liquid crystal display.

In another aspect, the present invention relates to a layered structure with silicon nanocrystals in a silicon-rich dielectric layer. In one embodiment, the layered structure has: (i) a substrate, (ii) a first conductive layer formed on the substrate, (iii) a silicon-rich dielectric layer formed on the first conductive layer, and (iv) a plurality of silicon nanocrystals distributed in the silicon-rich dielectric layer, wherein the plurality of silicon nanocrystals are formed by laser annealing upon the silicon-rich dielectric layer.

In one embodiment, the silicon-rich dielectric layer is a silicon-rich oxide film. The silicon-rich oxide film has a refractive index in the range of about 1.4 to 2.3. In another embodiment, the silicon-rich dielectric layer is a silicon-rich nitride film. The silicon-rich nitride film has a refractive index in the range of about 1.7 to 2.3.

The silicon-rich dielectric layer can be formed by using a plasma enhanced chemical vapor deposition (PECVD) process at a process temperature effective in the range of about 200° C. to 400° C., and a process time effective in a duration of about 13 seconds to 250 seconds to form a corresponding thickness in the range of about 50 nm to 1000 nm. The silicon content ratio $SiH_4/N_2O$ of the silicon-rich dielectric layer is adjustable to form the silicon-rich dielectric layer with a desired refractive index. In one embodiment, the silicon content ratio $SiH_4/N_2O$ is changeable in the range of about 1:10 to 1:1, resulting in a refractive index of the silicon-rich dielectric layer to be at least in the range of about 1.4 to 2.3, respectively.

In one embodiment, the plurality of the silicon nanocrystals are formed by laser annealing the silicon-rich dielectric layer with an adjustable frequency and an adjustable laser power density at a temperature below 400° C. The laser power density is adjustable in the range of about 70 to 300 $mJ/cm^2$, such that the plurality of the silicon nanocrystals is formed in a desired range of diameters. In one embodiment, the laser power density is adjustable in the range of about 70 to 200 $mJ/cm^2$, and the diameters of the plurality of the silicon nanocrystals are in the range of about 3 to 6 nm. In another embodiment, the laser power density is adjustable in the range of about 200 to 300 $mJ/cm^2$, and the diameters of the plurality of the silicon nanocrystals are in the range of about 4 to 10 nm.

In one embodiment, the thickness of the silicon-rich dielectric layer is in the range of about 100 to 500 nm. The density of the plurality of silicon nanocrystals in the silicon-rich dielectric layer is in the range of about $1\times10^{11}/cm^2$ to $1\times10^{12}/cm^2$.

In one embodiment, the layered structure has a second conductive layer. The second conductive layer can be a metal layer, an indium tin oxide layer, or a combination of them. In one embodiment, the second conductive layer is an indium tin oxide layer, which is usable in a liquid crystal display. In one embodiment, the layered structure with silicon nanocrystals in the silicon-rich dielectric layer is usable in a solar cell. In another embodiment, the layered structure with silicon nanocrystals in the silicon-rich dielectric layer is usable in a photodetector. In yet another embodiment, the layered structure with silicon nanocrystals in the silicon-rich dielectric layer is usable in a touch panel or ambient light sensor. In a further embodiment, the layered structure with silicon nanocrystals in the silicon-rich dielectric layer is usable in a nonvolatile memory device as storage nodes.

In yet another aspect, the present invention is related to a method for forming silicon nanocrystals in a silicon-rich dielectric layer. In one embodiment, the method includes the step of laser-annealing a silicon-rich dielectric layer to form a plurality of silicon nanocrystals in the silicon-rich dielectric layer. The silicon-rich dielectric layer can be formed on a first conductive layer, which in turn can be formed on a substrate.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 5 shows a photoluminescence measurement showing the photoluminescence intensity in relation to the wavelength of light emitted from a layered structure with silicon nanocrystals in a silicon-rich dielectric layer when the thickness of the silicon-rich dielectric layer is about 100 nm and the silicon-rich dielectric layer was excimer laser annealed at four different power levels according to embodiments of the present invention.

DETAILED DESCRIPTION OF THE INVENTION

Figure 1:
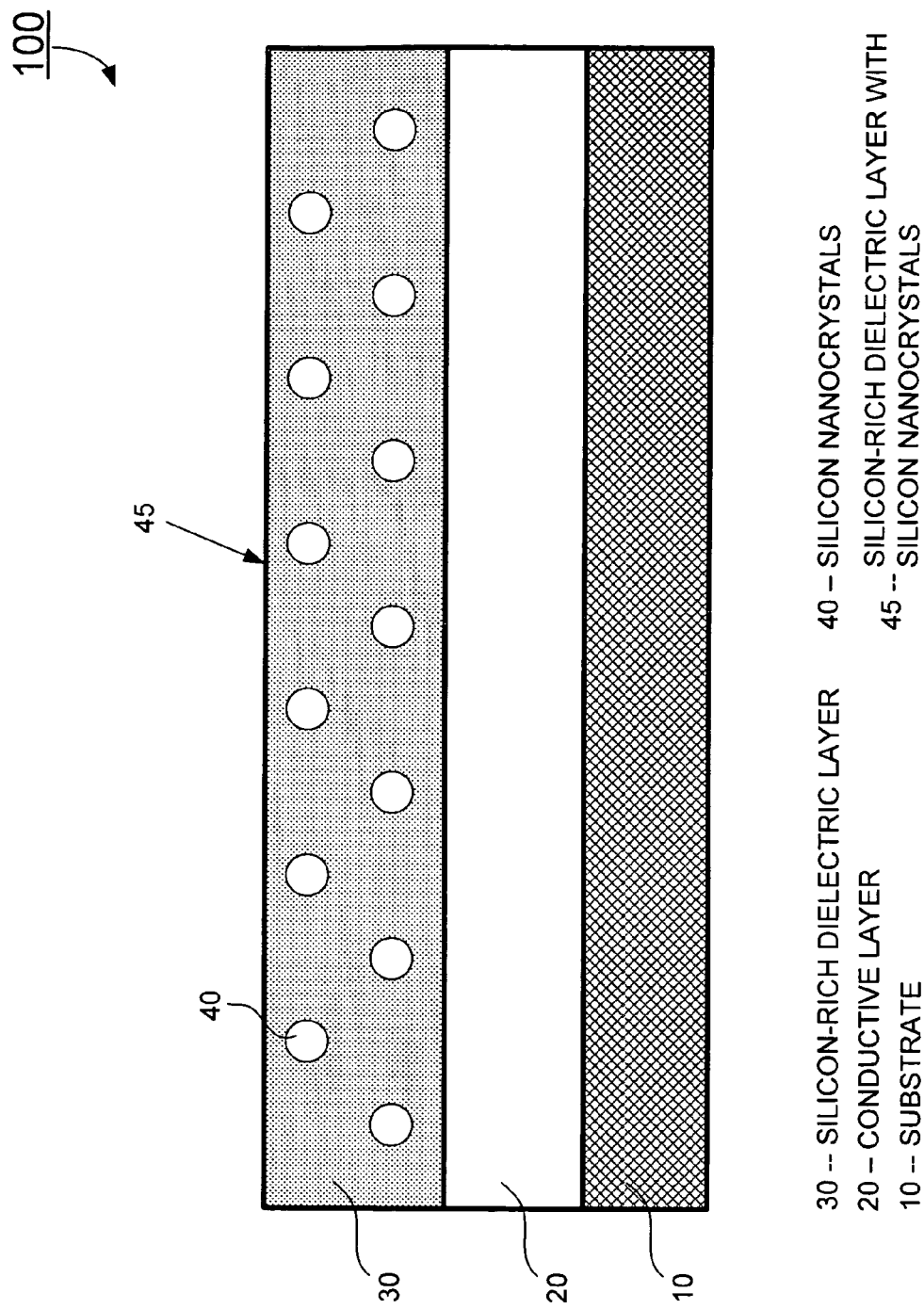
FIG. 1 shows a sectional view of a layered structure with silicon nanocrystals in a silicon-rich dielectric layer according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "about" or "approximately" shall generally mean within 20 percent, preferably within 10 percent, and more preferably within 5 percent of a given value or range. Numerical quantities given herein are approximate, meaning that the term "about" or "approximately" can be inferred if not expressly stated.

The description will be made as to the embodiments of the present invention in conjunction with the accompanying drawings in FIGS. 1-5. In accordance with the purposes of this invention, as embodied and broadly described herein, this invention relates to a method for manufacturing a layered structure 100 with silicon nanocrystals 40 in a silicon-rich dielectric layer 30.

Figure 2:
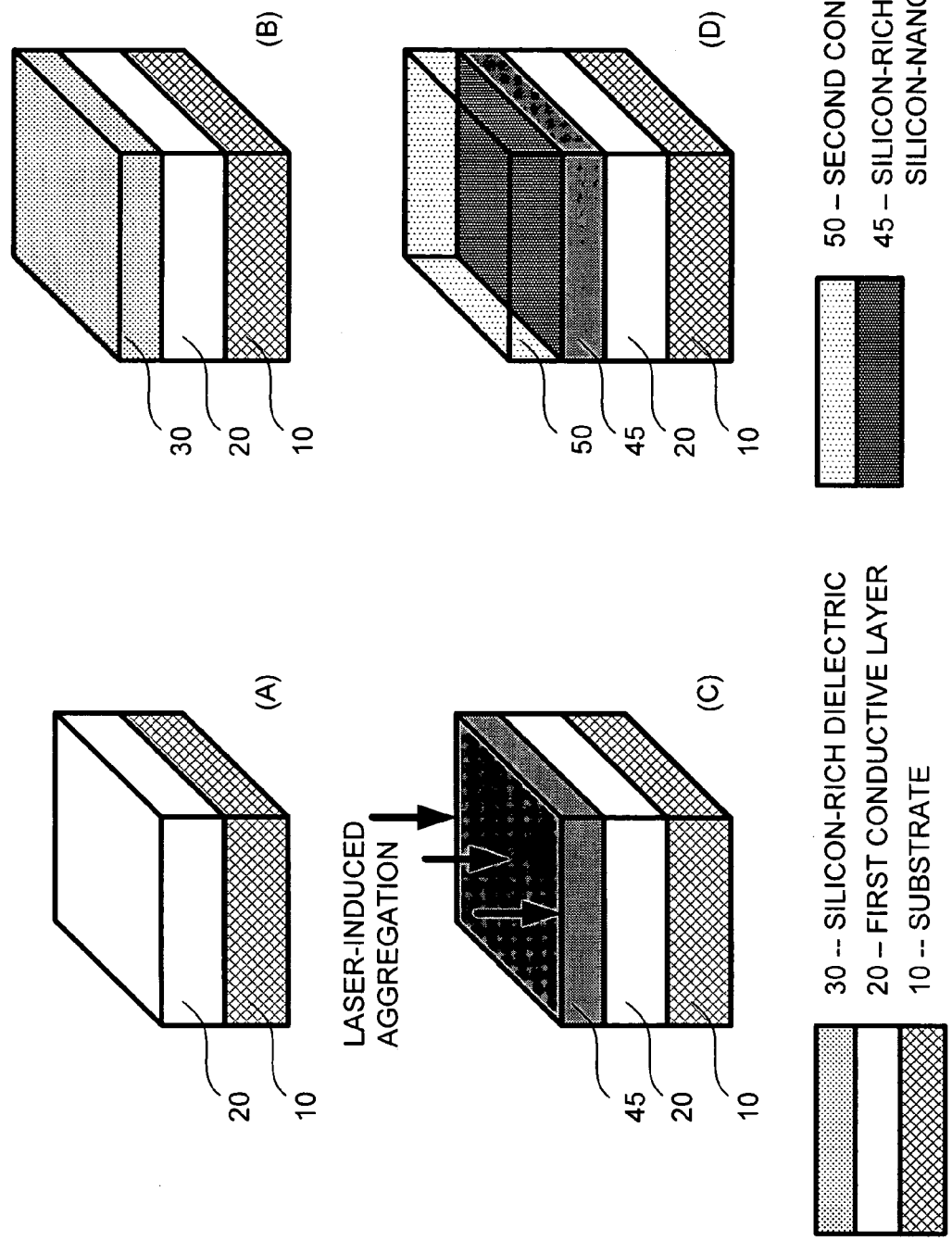
FIG. 2 shows a process of making a layered structure with silicon nanocrystals in a silicon-rich dielectric layer according to one embodiment of the present invention.
Figure 3:
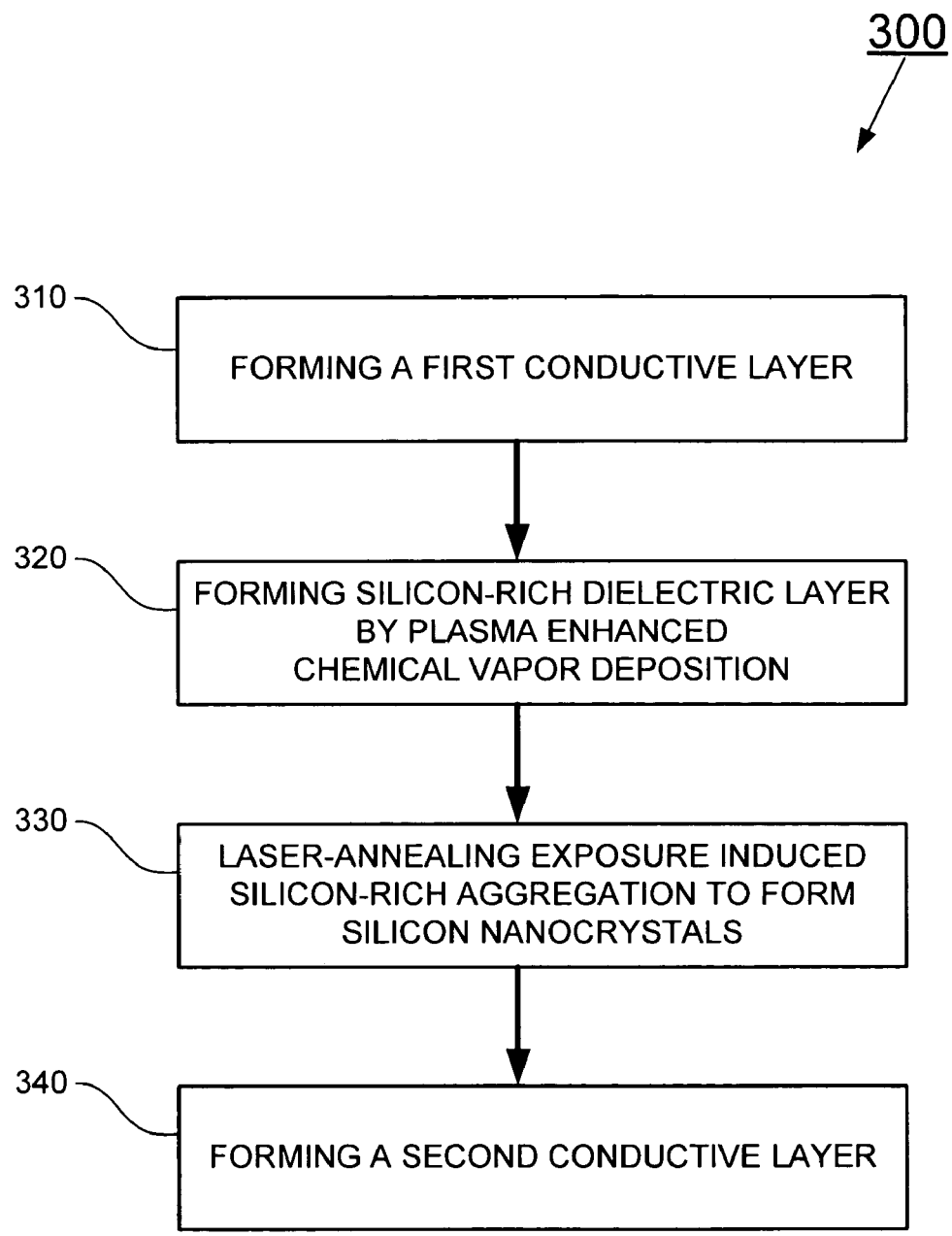
FIG. 3 shows a block diagram of the process as illustrated in FIG. 2, illustrating how the layered structure with silicon nanocrystals in a silicon-rich dielectric layer is manufactured according to one embodiment of the present invention.

Referring now to FIGS. 1 to 3, an exemplary layered structure 100 with silicon nanocrystals 40 in a silicon-rich dielectric layer 30, and its forming process are illustrated according to one embodiment of the present invention. FIG. 1 shows a sectional view of a layered structure 100 with silicon nanocrystals 40 in a silicon-rich dielectric layer 30. The layered structure 100 has a substrate 10, a conductive layer 20, and a silicon-rich dielectric layer 30, and a plurality of silicon nanocrystals 40 in the silicon-rich dielectric layer. As shown in FIG. 2, an additional conductive layer is formed on the silicon-rich dielectric layer 30. FIG. 3 shows a block diagram 300 of the process as illustrated in FIG. 2, showing how the layered structure 100 with silicon nanocrystals 40 in a silicon-rich dielectric layer 30 is formed.

In one embodiment as shown in FIG. 3, a process of forming the layered structure 100 with silicon nanocrystals 40 in the silicon-rich dielectric layer 30 includes the steps of:

(a) forming a first conductive layer on a substrate 10, as illustrated as step 310 in FIG. 3;

(b) forming a silicon-rich dielectric layer 30 on the first conductive layer 20, as illustrated as step 320 in FIG. 3;

(c) laser-annealing at least the silicon-rich dielectric layer 30 to induce silicon-rich aggregation in the layer 30 to form a plurality of silicon nanocrystals 40 in the silicon-rich dielectric layer 30, as illustrated as step 330 in FIG. 3; and (d) optionally forming a second conductive layer 50 on the silicon-rich dielectric layer 30, as illustrated as step 340 in FIG. 3.

These steps are not necessarily to be in sequence. Neither the process is the only way to practice the present invention. For example, in one embodiment, a method for forming silicon nanocrystals in a silicon-rich dielectric layer includes a step of laser-annealing a silicon-rich dielectric layer to form a plurality of nanocrystals in the silicon-rich dielectric layer.

In one embodiment, the substrate 10 is a glass substrate. In another embodiment, the substrate 10 is a plastic film.

The first conductive layer 20 and the second conductive layer 50 may be formed with metal, metal oxide or combination thereof. The metal may be aluminum, copper, silver, gold, titanium, molybdenum, lithium, alloy or combinations thereof. The metal oxide may be ITO, IZO or combination thereof.

In one embodiment, the silicon-rich dielectric layer 30 is a silicon-rich oxide film. In another embodiment, the silicon-rich dielectric layer 30 is a silicon-rich nitride film. The silicon-rich dielectric layer 30 is formed with a Plasma Enhanced Chemical Vapor Deposition (PECVD) process, at a low pressure of 1 torr, at a temperature below 400° C. In one embodiment, the silicon-rich dielectric layer 30 is formed at a temperature of 200 to 400° C., or 350 to 400° C., preferably at a temperature of 370° C. It takes about from 13 seconds to 250 seconds, preferably 25 seconds to 125 seconds, to form a silicon-rich dielectric layer 30 in a desirable thickness of 100 nm to 500 nm. During the process of forming the silicon-rich dielectric layer 30, the refractive index of the silicon-rich dielectric layer 30 is controlled through adjusting the silicon content ratio $SiH_4/N_2O$. In one embodiment, the silicon content ratio $SiH_4/N_2O$ is adjusted in the range of about 1:10 to 1:1, resulting in a refractive index at least in the range of about 1.4 to 2.3, preferably in the range of about 1:5 to 1:1, resulting in a refractive index at least in the range of about 1.5 to 2.3. The silicon-rich dielectric layer can also be formed with other methods or processes.

In order to produce an effective photoluminescence device, the refractive index of the silicon-rich dielectric layer 30 preferably is to be in a desirable range. In one embodiment, the silicon-rich oxide film has a refractive index in a range between 1.4 and 2.3. In another embodiment, the silicon-rich nitride film has a refractive index in a range between 1.7 and 2.3.

The laser annealing step includes the step of excimer laser annealing the silicon-rich dielectric layer 30 with an adjustable frequency and an adjustable laser power density at a temperature below 400° C. In one embodiment, the excimer laser annealing is performed at a pressure of about 1 atm (760 torr), or $1 \times e^{-3}$ Pa, and at a temperature below 400° C. In another embodiment, the excimer laser annealing is performed at a room temperature (i.e. about 20 to 25° C., or 68 to 77° F.). Other types of laser annealing with corresponding parameters may also be utilized to practice the present invention.

Figure 4:
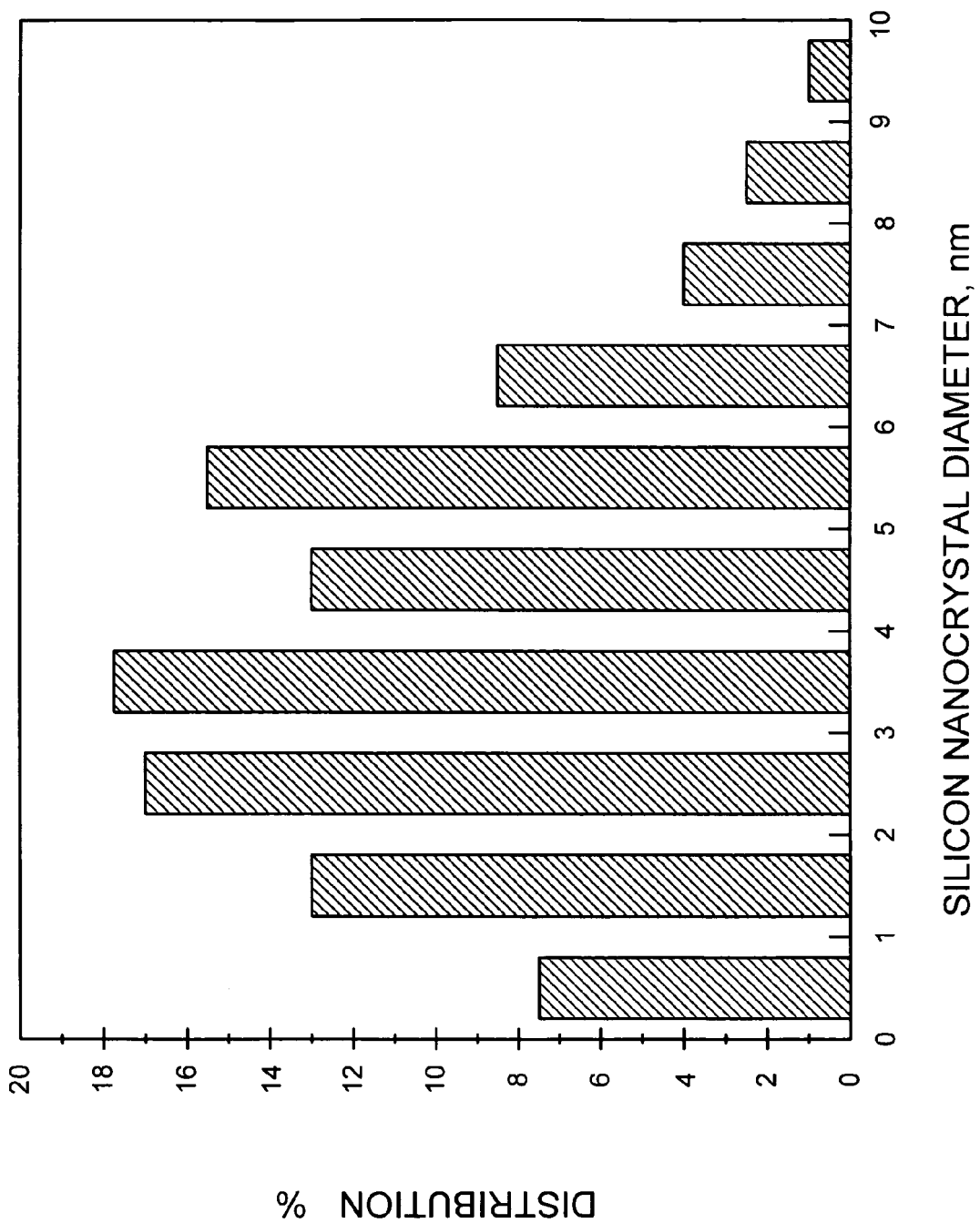
FIG. 4 illustrates the distribution of diameters of the nanocrystals in a silicon-rich dielectric layer according to one embodiment of the present invention.

The laser wavelength and the laser power level are adjustable to yield desirable diameters of the silicon nanocrystals. The desirable diameters of the silicon nanocrystals are in the range of about 3 to 10 nm, preferably in the range of about 3 to 6 nm. In one embodiment, the excimer laser annealing of the silicon-rich dielectric layer 30 is performed at a wavelength of 308 nm. The excimer laser annealing of the silicon-rich dielectric layer 30 is typically performed at a laser power density range of 70 to 300 mJ/cm$^2$, preferably at a laser power density range of 70 to 200 mJ/cm$^2$. However, when the laser power density exceeds 200 mJ/cm$^2$, the metal layer under the silicon-rich dielectric layer may be damaged, or peeled. In order to produce a silicon-rich dielectric layer with larger silicon nanocrystals in the range of about 4 to 10 nm, the excimer laser annealing of the silicon-rich dielectric layer 30 is preferably performed at a laser power density range of about 200 to 300 mJ/cm$^2$. On the other hand, in order to produce a silicon-rich dielectric layer with smaller silicon nanocrystals in the range of about 3 to 6 nm, the excimer laser annealing of the silicon-rich dielectric layer 30 is preferably performed at a laser power density range of about 70 to 200 mJ/cm$^2$. FIG. 4 illustrates the distribution of diameters of the nanocrystals in a silicon-rich dielectric layer 400 according to one embodiment of the present invention.

After the laser annealing step, the silicon-rich dielectric layer 30 becomes the silicon-rich dielectric layer 30 having a plurality of silicon nanocrystals 40. This silicon-rich dielectric layer having a plurality of silicon nanocrystals is referred with numeral reference number 45 in FIGS. 2C and 2D. The density of the silicon nanocrystals 40 in the silicon-rich dielectric layer 30 is preferably in the range of about $1\times10^{11}$/cm$^2$ to $1\times10^{12}$/cm$^2$. The silicon-rich dielectric layer can be further doped with N type or P type silicon.

After the silicon-rich dielectric layer 30 is excimer laser annealed, a second conductive layer 50 may be formed on the silicon-rich dielectric layer having a plurality of silicon nanocrystals 45, as illustrated as step 340 in FIG. 3, and FIG. 2D. Such a layered structure with a second conductive layer is usable for non-volatile memory devices, where the silicon nanocrystals 40 are adapted for using as storage nodes. In another embodiment, the second conductive layer 50 can be a transparent indium tin oxide (ITO) layer. Such a layered structure with a transparent ITO layer 50 is usable in a liquid crystal display. However, the second conductive layer 50 can be a metal layer while the first conductive layer 20 can be a transparent conductive layer, such as an indium tin oxide (ITO) layer or an indium zinc oxide (IZO) layer. The second conductive layer 50 can also be a transparent conductive layer, such as an indium tin oxide (ITO) layer or an indium zinc oxide (IZO) layer while the first conductive layer 20 can be a metal layer. Both of the first conductive layer 20 and the second conductive layer 50 can be made from one of transparent conductive layer and thin metal layer that may permit light to pass through.

FIG. 5 shows a photoluminescence measurement showing the photoluminescence intensity in relation to the wavelength of light emitted from a layered structure with silicon nanocrystals in a silicon-rich dielectric layer, where the thickness of the silicon-rich dielectric layer is about 100 nm and the silicon-rich dielectric layer was excimer laser annealed at four different power levels according to embodiments of the present invention.

The photoluminescence intensity of a photoluminescence device having a layer structure 100 with a silicon-rich dielectric layer having a plurality of silicon nanocrystals 45 is measured and shown in FIG. 5. The photoluminescence intensity level is measured against their wavelength in nm. The photoluminescence intensity levels are compared against four (4) separate embodiments of the photoluminescence devices made with different laser power density levels of the excimer laser annealing process. They are shown as curve 510 for a laser power density level of 100 mJ/cm$^2$, curve 520 for a laser power density level of 200 mJ/cm$^2$, curve 530 for a laser power density level of 300 mJ/cm$^2$, and curve 540 for a laser power density level of 400 mj/cm$^2$, respectively. The silicon-rich dielectric layers of various embodiments are seen to have peaks in their photoluminescence spectra in the range of about 350 nm and 550 nm, indicating the presence of silicon nanocrystals.

The methods disclosed in the present invention may be used to manufacture photoluminescence layer for light emitting devices, and/or photosensitive layer for light detection devices, with a high efficiency laser annealing process at low temperature. The silicon nanocrystals in the dielectric layer made according to embodiments of the present invention exhibits a high density, quite uniform and consistent distribution of the silicon nanocrystals, and consistent diameters of the silicon nanocrystals. The method disclosed in several embodiments of the present invention uses excimer laser annealing process at a low temperature. This process does not require high temperature post annealing and is compatible with the conventional process to produce low temperature polysilicon thin film transistor (LTPS TFT). The silicon-rich dielectric layer with silicon nanocrystals manufactured according embodiments of the present invention is usable for solar cells, touch panels, ambient light sensor, photodetectors, and also integrable with full color high quality TFT flat panel display. The silicon nanocrystals quantum dots manufactured according to several embodiments of the present invention is also usable as a storage node in non-volatile memory devices, with higher retention, higher endurance and higher operating speed.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for forming a layered structure with silicon nanocrystals, comprising the steps of:
    forming a first conductive layer on a substrate;
    forming a silicon-rich dielectric layer on the first conductive layer; and
    laser-annealing at least the silicon-rich dielectric layer to induce silicon-rich aggregation to form a plurality of silicon nanocrystals in the silicon-rich dielectric layer,
    wherein the step of forming the silicon-rich dielectric layer comprises the steps of:

using a plasma-enhanced chemical vapor deposition (PECVD) process under a first set of conditions effective to form the silicon-rich dielectric layer having a thickness in the range of about 50 nm to 1000 nm; and changing the silicon content ratio of the silicon-rich dielectric layer to form the silicon-rich dielectric layer with a desired refractive index, and wherein the first set of conditions comprises a process temperature effective in the range of about 350° C. to 400° C., and a process time effective in a duration of about 25 seconds to 125 seconds.

2. The method of claim 1, wherein the silicon-rich dielectric layer is comprised of silicon-rich oxide, silicon-rich nitride or the combination thereof.

3. The method of claim 1, wherein the silicon-rich dielectric layer has a refractive index in the range of about 1.5 to 2.3.

4. The method of claim 1, wherein the silicon content ratio $SiH_4/N_2O$ is changeable in the range of about 1:10 to 1:1, thereby resulting a refractive index at least in the range of about 1.5 to 2.3.

5. The method of claim 1, wherein the silicon content ratio $SiH_4/N_2O$ is changeable in the range of about 1:5 to 1:1, thereby resulting a refractive index at least in the range of about 1.5 to 2.3.

6. The method of claim 1, wherein the laser annealing step comprises the step of excimer laser annealing the silicon-rich dielectric layer with an adjustable frequency and an adjustable laser power density at a temperature below 400° C.

7. The method of claim 6, wherein the step of excimer laser annealing the silicon-rich dielectric layer further comprises the step of adjusting the laser power density of 70 to 300 $mJ/cm^2$ to form the plurality of silicon nanocrystals having diameters in the range of about 3 to 10 nm.

8. The method of claim 6, wherein the step of excimer laser annealing the silicon-rich dielectric layer further comprises the step of adjusting the laser power density of 70 to 200 $mJ/cm^2$ to form the plurality of silicon nanocrystals having diameters in the range of about 3 to 6 nm.

9. The method of claim 6, wherein the step of excimer laser annealing the silicon-rich dielectric layer further comprises the step of adjusting the laser power density of 200 to 300 $mJ/cm^2$ to form the plurality of silicon nanocrystals having diameters in the range of about 4 to 10 nm.

10. The method of claim 1, wherein the density of the plurality of silicon nanocrystals is in the range of about $1\times10^{11}/cm^2$ to $1\times10^{12}/cm^2$.

11. The method of claim 1, wherein the first conductive layer is comprised of metal, metal oxide or a combination thereof.

12. The method of claim 1, further comprising the step of forming a second conductive layer on the silicon-rich dielectric layer.

13. The method of claim 12, wherein the second conductive electrode is comprised of metal, metal oxide or a combination thereof.

14. A method for forming silicon nanocrystals, comprising the steps of:

using a plasma-enhanced chemical vapor deposition (PECVD) process under a first set of conditions effective to form a silicon-rich dielectric layer having a thickness in the range of about 50 nm to 1000 nm;

changing the silicon content ratio of the silicon-rich dielectric layer to form the silicon-rich dielectric layer with a desired refractive index; and laser-annealing the silicon-rich dielectric layer to form a plurality of silicon nanocrystals in the silicon-rich dielectric layer, wherein the laser annealing step comprises the step of excimer laser annealing the silicon-rich dielectric layer with an adjustable frequency and an adjustable laser power density at a temperature below 400° C., wherein the first set of conditions comprises a process temperature effective in the range of about 350° C. to 400° C., and a process time effective in a duration of about 25 seconds to 125 seconds.

15. The method of claim 14, wherein the silicon-rich dielectric layer is comprised of silicon-rich oxide, silicon-rich nitride or a combination thereof.

16. The method of claim 14, further comprising the step of:

providing a substrate; and forming the silicon-rich dielectric layer on the substrate before the step of laser-annealing the silicon-rich dielectric layer.

17. The method of claim 16, wherein the substrate is comprised of glass.

18. The method of claim 14, wherein the silicon-rich dielectric layer has a refractive index in the range of about 1.5 to 2.3.

19. The method of claim 14, wherein the silicon-rich dielectric layer has a refractive index in the range of about 1.7 to 2.3.

20. The method of claim 14, wherein the step of excimer laser annealing the silicon-rich dielectric layer further comprises the step of adjusting the laser power density of 70 $mJ/cm^2$ to 300 $mJ/cm^2$ to form the plurality of silicon nanocrystals having diameters in the range of about 3 nm to 10 nm.

21. The method of claim 14, wherein the step of excimer laser annealing the silicon-rich dielectric layer further comprises the step of adjusting the laser power density of 70 $mJ/cm^2$ to 200 $mJ/cm^2$ to form the plurality of silicon nanocrystals having diameters in the range of about 3 nm to 6 nm.

22. The method of claim 14, wherein the step of excimer laser annealing the silicon-rich dielectric layer further comprises the step of adjusting the laser power density of 200 $mJ/cm^2$ to 300 $mJ/cm^2$ to form the plurality of silicon nanocrystals having diameters in the range of about 4 nm to 10 nm.

* * * * *